United States Patent
Nakada (10) Patent No.: US 11,309,115 B2
(45) Date of Patent: Apr. 19, 2022

(54) MAGNETORESISTANCE EFFECT ELEMENT

(71) Applicant: TDK Corporation, Tokyo (JP)

(72) Inventor: Katsuyuki Nakada, Tokyo (JP)

(73) Assignee: TDK CORPORATION, Tokyo (JP)

( * ) Notice: Subject to any disclaimer, the term of this patent is extended or adjusted under 35 U.S.C. 154(b) by 148 days.

(21) Appl. No.: 16/777,036

(22) Filed: Jan. 30, 2020

(65) Prior Publication Data

US 2020/0251268 A1    Aug. 6, 2020

(30) Foreign Application Priority Data

Feb. 5, 2019 (JP) .............................. JP2019-018923
Jan. 27, 2020 (JP) .............................. JP2020-010941

(51) Int. Cl.
| | |
|---|---|
| *H01F 10/193* | (2006.01) |
| *H01F 10/32* | (2006.01) |
| *G01R 33/09* | (2006.01) |

(52) U.S. Cl.
CPC ......... *H01F 10/193* (2013.01); *G01R 33/093* (2013.01); *H01F 10/1936* (2013.01); *H01F 10/324* (2013.01); *H01F 10/325* (2013.01); *H01F 10/3272* (2013.01); *H01F 10/3268* (2013.01)

(58) Field of Classification Search
None
See application file for complete search history.

(56) References Cited

U.S. PATENT DOCUMENTS

| | | | |
|---|---|---|---|
| 6,876,522 B2 | 4/2005 | Ambrose et al. | |
| 8,064,244 B2* | 11/2011 | Zhang | G01R 33/098 365/158 |
| 9,643,385 B1* | 5/2017 | Butler | C22C 27/00 |
| 2006/0183002 A1* | 8/2006 | Yang | G11B 5/3903 428/811 |
| 2006/0262460 A1* | 11/2006 | Ide | H01F 10/3295 360/324.12 |
| 2009/0141410 A1* | 6/2009 | Jogo | G11C 11/1659 360/324.2 |
| 2010/0072529 A1* | 3/2010 | Marukame | H01L 29/66984 257/295 |

(Continued)

FOREIGN PATENT DOCUMENTS

JP    2012-190914 A    10/2012

OTHER PUBLICATIONS

Qiu et al. (J Apppl. Phys. 105, 07C932, 2009) (Year: 2009).*

(Continued)

*Primary Examiner* — Kevin M Bernatz
(74) *Attorney, Agent, or Firm* — Oliff PLC (57) ABSTRACT

A magnetoresistance effect element includes a first ferromagnetic layer, a second ferromagnetic layer, and a nonmagnetic spacer layer between the first ferromagnetic layer and the second ferromagnetic layer, in which at least one of the first ferromagnetic layer and the second ferromagnetic layer contains a metal compound having a half-Heusler type crystal structure, the metal compound contains a functional material, and X atoms, Y atoms, and Z atoms which form a unit lattice of the half-Heusler type crystal structure, and the functional material has an atomic number lower than an atomic number of any of the X atoms, the Y atoms, and the Z atoms.

15 Claims, 3 Drawing Sheets

(56) References Cited

U.S. PATENT DOCUMENTS

| | | | | |
|---|---|---|---|---|
| 2013/0236639 | A1* | 9/2013 | Carey | G11B 5/3906 427/130 |
| 2016/0380185 | A1* | 12/2016 | Kato | H01L 27/228 257/421 |
| 2017/0077394 | A1* | 3/2017 | Saida | H01L 43/08 |
| 2020/0051724 | A1* | 2/2020 | Doyle | H01F 10/3272 |
| 2021/0043225 | A1* | 2/2021 | Inubushi | C23C 14/081 |
| 2021/0043226 | A1* | 2/2021 | Inubushi | H01F 10/325 |
| 2021/0043682 | A1* | 2/2021 | Nakada | G11C 19/0833 |
| 2021/0265562 | A1* | 8/2021 | Ichikawa | H01L 43/08 |

OTHER PUBLICATIONS

Shinohara et al. (AIP Advances 8, 055923, 2018) (Year: 2018).*

Wen et al.; "Fully expitaxial C1b-type NiMnSb half-Heusler alloy films for current-perpendicular-to-plane giant magnetoresistance devices with a Ag spacer"; Scientific Reports; vol. 5, 18387; 2015; pp. 1-10.

Goripati et al.; "Bi-quadratic interlayer exchange coupling in Co2MnSi/Ag/Co2MnSi pseudo spin-valve"; Journal of Applied Physics; vol. 110, 123914; 2011; pp. 123914-1-123914-7.

Furubayashi et al.; "Structure and transport properties of current-perpendicular-to-plane spin valves using Co2FeAl0.5Si0.5 and Co2MnSi Heusler alloy electrodes"; Journal of Applied Physics; vol. 107, 113917; 2010; pp. 113911-1-113911-7.

Kasai et al.; "Large magnetoresistance in Heusler-alloy-based expitaxial magnetic junctions with semiconducting Cu (In0.8Ga0.2)Se2 space"; vol. 109, 032409; 2016 pp. 032409-1-032409-4.

Galanakis et al.; "Electronic structure and Slater-Pauling behavior in half-metallic Heusler alloys calculated from first principles"; Journal of Physics D: Applied Physics; vol. 39 765; 2006; pp. 765-775.

Kwon et al.; "Anisotropic magnetoresistance and current-perpendicular-to-plane giant magnetoresistance in expitaxial NiMnSb-based multilaers"; Journal of Applied Physics; vol. 119, 023902; 2016; pp. 023902-1-023902-6.

* cited by examiner

MAGNETORESISTANCE EFFECT ELEMENT

CROSS-REFERENCE TO RELATED APPLICATION

This application is based upon and claims the benefit of priority from Japanese Patent Application No. 2019-018923, Feb. 5, 2019; and Japanese Patent Application No. 2020-10941, Jan. 27, 2020, the entire contents of which are incorporated herein by reference.

BACKGROUND

Field

The present invention relates to a magnetoresistance effect element.

Description of Related Art

A giant magnetoresistance (GMR) element formed of a multilayer film including a ferromagnetic layer and a nonmagnetic layer, and a tunnel magnetoresistance (TMR) element in which an insulating layer (a tunnel barrier layer, a barrier layer) is used for a nonmagnetic layer are known. Attention has focused on GMR elements and TMR elements as elements for magnetic sensors, magnetic heads, high frequency components, and magnetic random access memories (MRAM). A magnetoresistance effect element has a magnetoresistance effect ratio (MR ratio) as one performance indicator, and development to increase the magnetoresistance effect ratio (MR ratio) has been progressed. It has been reported that the MR ratio increases when a highly spin-polarized material is used for a ferromagnetic layer, and a Heusler alloy is an example of a highly spin-polarized material.

Non-Patent Document [1] discloses a GMR element expressed by NiMnSb/Ag/NiMnSb in which NiMnSb having a half-Heusler type crystal structure, which is one of Heusler alloys, is used for a ferromagnetic layer, and Ag is used for a nonmagnetic layer.

PATENT DOCUMENTS

[Non-Patent Document 1] Scientific Reports 5. 18387 (2015)

SUMMARY OF THE INVENTION

AMR ratio of the magnetoresistance effect element described in Non-Patent Document [1] is at most 8% at room temperature, and an MR ratio to such an extent as expected is not obtained. One reason for this is thought to be that a half-Heusler type crystal structure has lattice vacancies. Lattice vacancies are thought to cause distortion of a crystal structure, and distortion of a crystal structure lowers the MR ratio.

The present disclosure has been made in view of the above circumstances, and an objective thereof is to provide a magnetoresistance effect element in which an MR ratio can be improved.

As a result of intensive research, the present inventors have found that, when a predetermined element is added to a material constituting a ferromagnetic layer, a crystal structure of the ferromagnetic layer is stabilized and a MR ratio of the magnetoresistance effect element is improved. That is, the present invention provides the following methods in order to solve the above-described problems.

(1) A magnetoresistance effect element according to a first aspect includes a first ferromagnetic layer, a second ferromagnetic layer, and a nonmagnetic spacer layer between the first ferromagnetic layer and the second ferromagnetic layer, in which at least one of the first ferromagnetic layer and the second ferromagnetic layer contains a metal compound having a half-Heusler type crystal structure, the metal compound contains a functional material, and X atoms, Y atoms, and Z atoms that form a unit lattice of the half-Heusler type crystal structure, and the functional material has an atomic number lower than an atomic number of any of the X atoms, the Y atoms, and the Z atoms. When this constitution is satisfied, the metal compound having a half-Heusler type crystal structure has a stable crystal structure while a high spin polarization is maintained. As a result, the MR ratio of the magnetoresistance effect element is improved.

(2) In the magnetoresistance effect element according to the above-described aspect, the functional material may be one or more of atoms selected from the group consisting of B, C, N, and F. When this constitution is satisfied, the crystal structure is further stabilized. As a result, the MR ratio of the magnetoresistance effect element is improved.

(3) In the magnetoresistance effect element according to the above-described aspect, a compositional proportion of the functional material in the metal compound may be 0.1 at % (0.1 mol %) or more and 7 at % (7 mol %) or less. When this constitution is satisfied, the crystal structure is further stabilized. As a result, the MR ratio of the magnetoresistance effect element is improved.

(4) In the magnetoresistance effect element according to the above-described aspect, the functional material may be boron, and a composition proportion of the functional material in the metal compound may be 0.1 at % or more and 9.8 at % or less.

(5) In the magnetoresistance effect element according to the above-described aspect, the functional material may be carbon, and a composition proportion of the functional material in the metal compound may be 0.11 at % or more and 8.8 at % or less.

(6) In the magnetoresistance effect element according to the above-described aspect, the functional material may be nitrogen, and a composition proportion of the functional material in the metal compound may be 0.09 at % or more and 7.2 at % or less.

(7) In the magnetoresistance effect element according to the above-described aspect, the functional material may be fluorine, and a composition proportion of the functional material in the metal compound may be 0.13 at % or more and 7.2 at % or less.

(8) In the magnetoresistance effect element according to the above-described aspect, the X atoms may be one or more of atoms selected from the group consisting of Fe, Co, Ni, Cu, Zn, Ru, Rh, Pd, Ag, Cd, Ir, Pt, and Au, the Y atoms may be one or more of atoms selected from the group consisting of Ti, V, Cr, Mn, Y, Zr, Nb, Hf, Ta, Gd, Tb, Dy, Hd, Er, Fe, Tm, Yb, and Lu, and the Z atoms may be one or more of atoms selected from the group consisting of Al, Si, Ga, Ge, As, In, Sn, Sb, Tl, Pd, Bi, Se, and Te. When this constitution is satisfied, the crystal structure tends to be stabilized due to the constitution satisfying the composition of a Heusler ally and fabrication thereof is facilitated.

(9) In the magnetoresistance effect element according to the above-described aspect, the X atoms may be one or more of atoms selected from the group consisting of Ni, Pd, Pt, Co, and Rh, the Y atoms may be one or more of atoms selected from the group consisting of Mn, Cr, Fe, and V, and the Z atoms may be one or more of atoms selected from the group consisting of Se, Te, and Sb. When this constitution is satisfied, a spin polarization of the ferromagnetic Heusler alloy contained in the first ferromagnetic layer and/or the second ferromagnetic layer is increased, and as a result, the MR ratio of the magnetoresistance effect element is increased.

(10) In the magnetoresistance effect element according to the above-described aspect, the metal compound may have a crystal structure of a $C1_b$ structure or a B2 structure. When this constitution is satisfied, a spin polarization of the ferromagnetic Heusler alloy contained in the first ferromagnetic layer and/or the second ferromagnetic layer is increased, and as a result, the MR ratio of the magnetoresistance effect element is increased.

(11) In the magnetoresistance effect element according to the above-described aspect, one of the first ferromagnetic layer and the second ferromagnetic layer may contain a metal compound having a half-Heusler type crystal structure, and the other thereof may contain a metal compound having a full-Heusler type crystal structure, and the metal compound having a full-Heusler type crystal structure may contain the X atoms, the Y atoms, and the Z atoms. When this constitution is satisfied, the spin polarization of at least one of the first ferromagnetic layer and the second ferromagnetic layer can be further increased, and as a result, the MR ratio of the magnetoresistance effect element is increased.

(12) In the magnetoresistance effect element according to the above-described aspect, the metal compound having a full-Heusler type crystal structure may be expressed by a compositional formula $Co_2L_\alpha M_\beta$, and L atoms may include at least one of Mn and Fe atoms, $\alpha$ may satisfy $0.7<\alpha<1.6$, M atoms may include at least one of Al, Si, Ge, and Ga atoms, and $\beta$ may satisfy $0.65<\beta<1.35$. When this constitution is satisfied, the spin polarization of at least one of the first ferromagnetic layer and the second ferromagnetic layer is further increased, and as a result, the MR ratio of the magnetoresistance effect element is increased.

(13) The magnetoresistance effect element according to the above-described aspect may include an insertion layer between at least one of the first ferromagnetic layer and the second ferromagnetic layer, and the nonmagnetic spacer layer, in which the insertion layer may contain Co, Fe, or a CoFe alloy. When this constitution is satisfied, the insertion layer eliminates mismatching at an interface between the ferromagnetic layer and the nonmagnetic spacer layer, and a magnetization stability of the ferromagnetic layer is increased. As a result, temperature dependence of the MR ratio of the magnetoresistance effect element decreases.

(14) In the magnetoresistance effect element according to the above-described aspect, a film thickness of the insertion layer may be 0.2 nm or more and 1.2 nm or less. When this constitution is satisfied, a high MR ratio can be obtained while temperature dependence of the MR ratio is maintained.

(15) In the magnetoresistance effect element according to the above-described aspect, the nonmagnetic spacer layer may be a metal. When this constitution is satisfied, the magnetoresistance effect element exhibits a low RA (product of resistance and area) and a high MR ratio.

(16) In the magnetoresistance effect element according to the above-described aspect, the nonmagnetic spacer layer may be Ag or an Ag alloy. When this constitution is satisfied, the magnetoresistance effect element exhibits a low RA and a higher MR ratio.

According to the present disclosure, an MR ratio of the magnetoresistance effect element can be improved.

DETAILED DESCRIPTION

Hereinafter, the present invention will be described in detail with reference to the drawings as appropriate. In the drawings used in the following description, there are cases in which characteristic portions are appropriately enlarged for convenience of illustration so that characteristics of the present invention can be easily understood, and dimensional proportions of respective constituent elements may be different from actual ones. Materials, dimensions, and the like shown in the following description are merely examples, and the present invention is not limited thereto and can be implemented with appropriate modifications within a range not changing the gist of the present invention.

"Magnetoresistance Effect Element"

Figure 1:
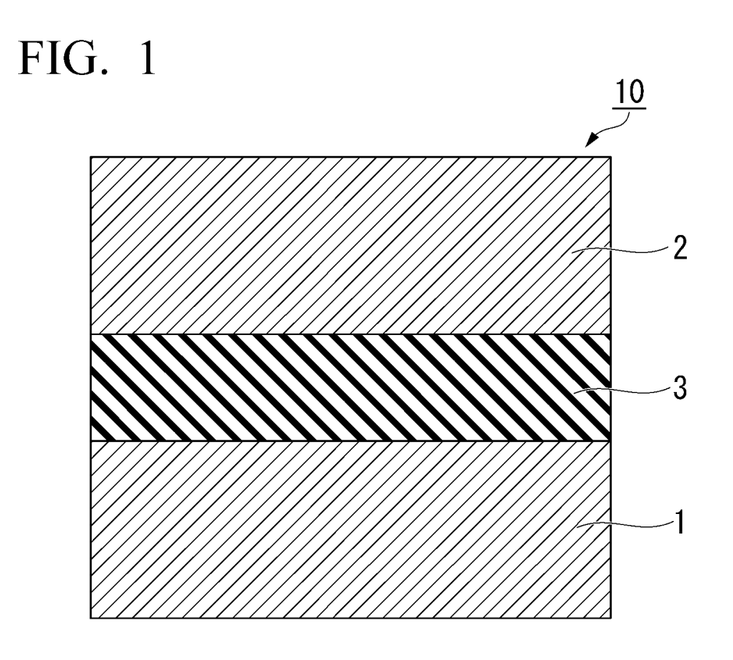
FIG. 1 is a schematic cross-sectional view of a magnetoresistance effect element according to the present embodiment.

FIG. 1 is a schematic cross-sectional view of a magnetoresistance effect element according to the present embodiment. A magnetoresistance effect element 10 shown in FIG. 1 includes a first ferromagnetic layer 1, a second ferromagnetic layer 2, and a nonmagnetic spacer layer 3. Also, the magnetoresistance effect element 10 may include a cap layer, an underlayer, or the like besides these layers. Hereinafter, a direction perpendicular to a plane in which the first ferromagnetic layer 1 extends is referred to as a lamination direction in some cases.

(First Ferromagnetic Layer and Second Ferromagnetic Layer)

The first ferromagnetic layer 1 and the second ferromagnetic layer 2 each contain a ferromagnetic material and have magnetization. The magnetoresistance effect element 10 outputs change in relative angle between these magnetizations as change in resistance value. For example, when a magnetization direction of the second ferromagnetic layer 2 is fixed in one direction and a magnetization direction of the first ferromagnetic layer 1 is made variable with respect to the magnetization direction of the second ferromagnetic layer 2, the magnetization direction of the first ferromagnetic layer 1 changes with respect to the magnetization direction of the second ferromagnetic layer 2. As a result, a relative angle between the two magnetizations changes, and a resistance value of the magnetoresistance effect element 10 changes. The thickness of the first ferromagnetic layer 1 may be, for example, 1 nm to 20 nm, and a thickness of the second ferromagnetic layer 2 may be, for example, 1 nm to 20 nm. A layer whose magnetization direction is fixed is generally called a fixed layer, and a layer whose magnetization direction is variable is generally called a free layer. The first ferromagnetic layer 1 and the second ferromagnetic layer 2 may each be formed of a plurality of layers. Hereinafter, a case in which the first ferromagnetic layer 1 is the free layer and the second ferromagnetic layer is the fixed layer will be described as an example.

At least one of the first ferromagnetic layer 1 and the second ferromagnetic layer 2 contains a ferromagnetic Heusler alloy and is preferably made of substantially a ferromagnetic Heusler alloy. A ferromagnetic Heusler alloy has a half-Heusler type crystal structure whose compositional formula is expressed as XYZ as a stoichiometric composition, and a full-Heusler type crystal structure whose compositional formula (chemical formula) is expressed as $X_2YZ$ as a stoichiometric composition. At least one of the first ferromagnetic layer 1 and the second ferromagnetic layer 2 contains a metal compound having a half-Heusler type crystal structure. At least one of the first ferromagnetic layer 1 and the second ferromagnetic layer 2 may be made of, for example, a metal compound having a half-Heusler type crystal structure. The metal compound forms, for example, a metal compound layer that extends in a plane intersecting a lamination direction. The metal compound includes X atoms, Y atoms, Z atoms, and a functional material. The X atoms, the Y atoms, and the Z atoms are respective atoms which form a unit lattice of the half-Heusler type crystal structure as expressed by the compositional formula. The functional material is an atom having an atomic number lower than an atomic number of any of the X atoms, the Y atoms and the Z atoms. The functional material is not limited to one type of atom and may include atoms of two or more types. The functional material may be, for example, Li, Be, B, C, N, O, F, Na, or Mg. The functional material has a small particle size and mainly penetrates between lattices of the half-Heusler type crystal structure. Since the functional material penetrates into vacant lattice points without significantly distorting the half-Heusler type crystal structure, the half-Heusler type crystal structure is stabilized. As a result, a magnetoresistance effect of the magnetoresistance effect element 10 increases.

Here, "expressed as the compositional formula XYZ or $X_2YZ$ as a stoichiometric composition" means that the compound is not limited to a stoichiometric composition and may be a non-stoichiometric composition. That is, in a case in which a compositional formula is XYZ, a ratio between the X atoms, the Y atoms, and the Z atoms does not need to be exactly 1:1:1, and in a case in which a compositional formula is $X_2YZ$, a ratio between the X atoms, the Y atoms, and the Z atoms does not need to be exactly 2:1:1.

The functional material may be one or more selected from the group consisting of B, C, N, and F. These atoms stabilize the half-Heusler type crystal structure, and further stabilize a crystal structure of at least one of the first ferromagnetic layer 1 and the second ferromagnetic layer 2.

A composition proportion of the functional material according to a definition to be described below may be 0.1 at % or more and 7 at % or less.

When the functional material is boron (B), a composition proportion of the functional material in the metal compound may be, for example, 0.1 at % or more and 9.8 at % or less, preferably 0.6 at % or more and 9.8 at % or less, and more preferably 3.9 at % or more and 7.3 at % or less.

When the functional material is carbon (C), a composition proportion of the functional material in the metal compound may be, for example, 0.11 at % or more and 8.8 at % or less, preferably 4.2 at % or more and 8.8 at % or less, and more preferably 5.6 at % or more and 6.3 at % or less.

When the functional material is nitrogen (N), a composition proportion of the functional material in the metal compound may be, for example, 0.09 at % or more and 7.2 at % or less, preferably 3.2 at % or more and 7.2 at % or less, and more preferably 4.7 at % or more and 5.7 at % or less.

When the functional material is fluorine (F), a composition proportion of the functional material in the metal compound may be, for example, 0.13 at % or more and 7.2 at % or less, preferably 0.9 at % or more and 7.2 at % or less, and more preferably 3.7 at % or more and 4.7 at % or less.

The X atoms forming a unit lattice of the half-Heusler type crystal structure may be, for example, one or more of atoms selected from the group consisting of Fe, Co, Ni, Cu, Zn, Ru, Rh, Pd, Ag, Cd, Ir, Pt, and Au. The Y atoms forming a unit lattice of the half-Heusler type crystal structure may be, for example, one or more of atoms selected from the group consisting of Ti, V, Cr, Mn, Y, Zr, Nb, Hf, Ta, Gd, Tb, Dy, Hd, Er, Fe, Tm, Yb, and Lu. However, a case in which both the X atoms and the Y atoms are Fe atoms is excluded. The Z atoms forming a unit lattice of the half-Heusler type crystal structure may be, for example, one or more of atoms selected from the group consisting of Al, Si, Ga, Ge, As, In, Sn, Sb, Tl, Pd, Bi, Se, and Te.

The X atoms are preferably one or more of atoms selected from the group consisting of Ni, Pd, Pt, Co, and Rh. The Y atoms are preferably one or more of atoms selected from the group consisting of Mn, Cr, Fe, and V. The Z atoms are preferably one or more of atoms selected from the group consisting of Se, Te, and Sb. A metal compound having a half-Heusler type crystal structure (XYZ) may be, for example, NiMnSe, NiMnTe, NiMnSb, PtMnSb, PdMnSb, CoFeSb, NiFeSb, RhMnSb, CoMnSb, IrMnSb, and NiCrSb.

A half-Heusler alloy may have, for example, a crystal structure of any of an A2 structure, a B2 structure, and a $C1_b$ structure. Here, "having any of the crystal structures" means that it includes a case in which, for example, a part of a $C1_b$ structure may have an A2 structure or a B2 structure.

Here, crystal structures of a half-Heusler alloy and a full-Heusler alloy to be described below will be described with reference to FIG. 2.

Figure 2A:
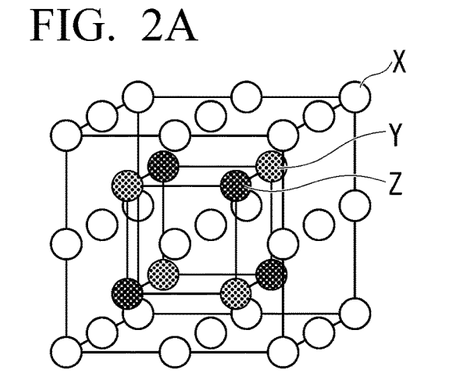
FIG. 2A is a schematic view of a crystal structure of a Heusler alloy according to the present embodiment.
Figure 2B:
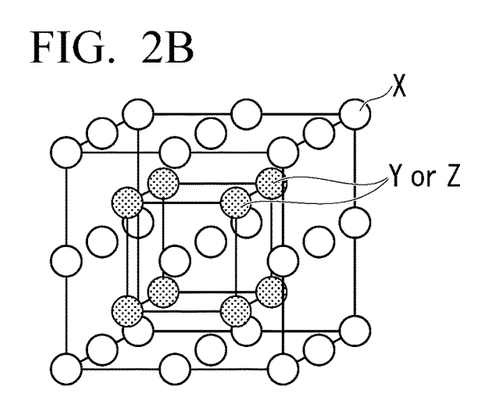
FIG. 2B is a schematic view of a crystal structure of a Heusler alloy according to the present embodiment.
Figure 2C:
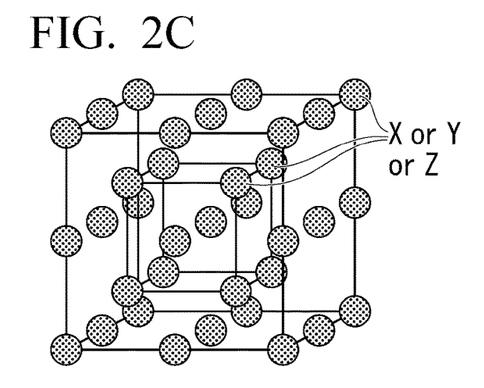
FIG. 2C is a schematic view of a crystal structure of a Heusler alloy according to the present embodiment.
Figure 2D:
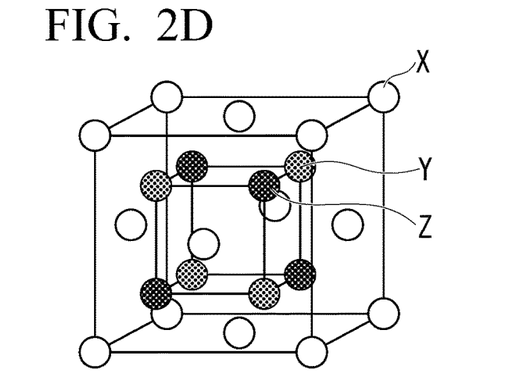
FIG. 2D is a schematic view of a crystal structure of a Heusler alloy according to the present embodiment.
Figure 2E:
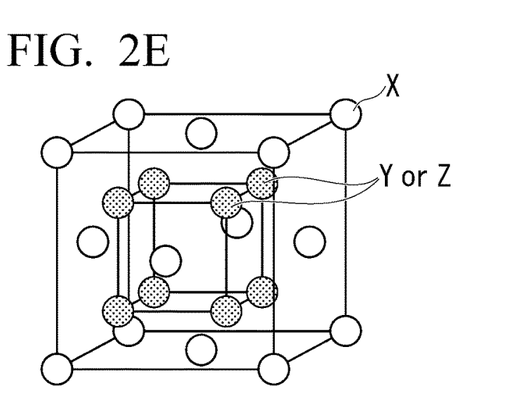
FIG. 2E is a schematic view of a crystal structure of a Heusler alloy according to the present embodiment.
Figure 2F:
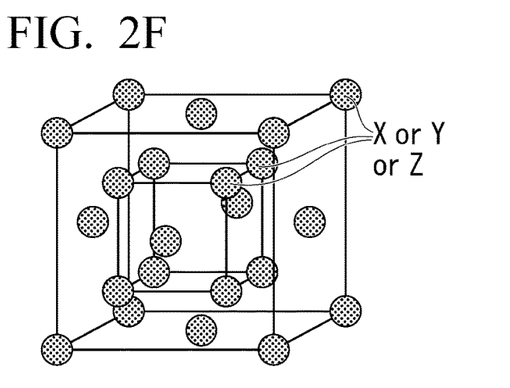
FIG. 2F is a schematic view of a crystal structure of a Heusler alloy according to the present embodiment.

FIGS. 2A, 2B, and 2C are schematic views of crystal structures which tend to be selected by the compound (full-Heusler alloy) expressed by the compositional formula $X_2YZ$. FIGS. 2D, 2E, and 2F are schematic diagrams of crystal structures which tend to be selected by the compound (half-Heusler alloy) expressed by the compositional formula XYZ.

FIG. 2A shows an $L2_1$ structure, FIG. 2D shows a $C1_b$ structure, and in these structures, X atoms, Y atoms, and Z atoms are positioned at predetermined sites. A unit lattice of the $L2_1$ structure is formed of four face-centered cubic lattices (fcc), and a structure obtained by removing one X atom therefrom is the $C1_b$ structure. Therefore, the $C1_b$ structure has vacant lattice points compared to the $L2_1$ structure.

FIG. 2B shows a B2 structure derived from the $L2_1$ structure, and FIG. 2E shows a B2 structure derived from the $C1_b$ structure. In these crystal structures, X atoms are positioned at predetermined sites, but Y atoms and Z atoms are not positioned at the most stable sites and are randomly accommodated at respective sites. That is, a disturbance occurs in a probability of Y atoms and Z atoms being accommodated at specific sites. FIG. 2C shows an A2 structure derived from the $L2_1$ structure, and FIG. 2F shows an A2 structure derived from the $C1_b$ structure. In these crystal structures, the X atom, the Y atom, and the Z atom are not positioned at the most stabilized sites but are randomly accommodated at respective sites. That is, a disturbance occurs in a probability of the X atom, the Y atom, and the Z atom being accommodated at specific sites. Compounds expressed by the compositional formula $X_2YZ$ have properties of becoming increasingly crystalline in the order of $L2_1$ structure>B2 structure>A2 structure. Compounds expressed by the compositional formula XYZ have properties of becoming increasingly crystalline in the order of $C1_b$ structure>B2 structure>A2 structure. A crystal structure of a half-Heusler alloy is preferably the $C1_b$ structure or the B2 structure.

Also, one of the first ferromagnetic layer 1 and the second ferromagnetic layer 2 may contain a metal compound having a half-Heusler type crystal structure, and the other thereof may contain a metal compound having a full-Heusler type crystal structure whose compositional formula is expressed by $X_2YZ$. One of the first ferromagnetic layer 1 and the second ferromagnetic layer 2 may be made of a metal compound having a full-Heusler type crystal structure.

The X atoms, the Y atoms, and the Z atoms forming a unit lattice of the full-Heusler type crystal structure are the same as the X atoms, the Y atoms, and the Z atoms forming a unit lattice of the half-Heusler type crystal structure. The X atoms may be, for example, one or more of atoms selected from the group consisting of Fe, Co, Ni, Cu, Zn, Ru, Rh, Pd, Ag, Cd, 1r, Pt, and Au. The Y atoms are one or more of atoms selected from Ti, V, Cr, Mn, Y, Zr, Nb, Hf, Ta, Gd, Tb, Dy, Hd, Er, Fe, Tm, Yb, and Lu, and the Z atoms are one or more of atoms selected from Al, Si, Ga, Ge, As, In, Sn, Sb, Tl, Pd and Bi. Examples of the metal compound having a full-Heusler type crystal structure ($X_2YZ$) include $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, and the like.

The metal compound having a full-Heusler type crystal structure ($X_2YZ$) may be, for example, $Co_2L_\alpha M_\beta$. L atoms are an aspect of the above-described Y atoms, and may be, for example, one or more of atoms of Mn and Fe. M atoms are an aspect of the above-described Z atoms and is one or more of atoms selected from the group consisting of Si, Al, Ga, and Ge. Also, $Co_2L_\alpha M_\beta$ satisfies $0.7<\alpha<1.6$ and satisfies $0.65<\beta<1.35$.

The Heusler alloy expressed by $Co_2L_\alpha M_\beta$ has a high spin polarization. Therefore, the magnetoresistance effect element 10 exhibits a large magnetoresistance effect. Also, when the conditions of $0.7<\alpha<1.6$ and $0.65<\beta<1.35$ are satisfied, a lattice constant of the Heusler alloy has a small difference from a lattice constant when a stoichiometric composition thereof is satisfied. Therefore, lattice mismatching between the first ferromagnetic layer 1 and/or the second ferromagnetic layer 2, and the nonmagnetic spacer layer 3 decreases. As a result, the magnetoresistance effect element exhibits a high MR ratio. However, the condition of $0.7<\alpha<1.6$ and $0.65<\beta<1.35$ may not necessarily be satisfied in the Heusler alloy.

A Heusler alloy having a full-Heusler type crystal structure has a crystal structure of an A2 structure, a B2 structure, or an $L2_1$ structure. A Heusler alloy having a B2 structure exhibits a higher spin polarization than a Heusler alloy having an A2 structure. A Heusler alloy having an $L2_1$ structure exhibits a higher spin polarization than the Heusler alloy having the B2 structure.

Also, at least one of the first ferromagnetic layer 1 and the second ferromagnetic layer 2 may contain a ferromagnetic material that is not a Heusler alloy. The ferromagnetic material may be, for example, a soft magnetic material. The ferromagnetic material may be, for example, a ferromagnetic layer that extends in a plane intersecting the lamination direction. The ferromagnetic material may be, for example, a metal selected from the group consisting of Cr, Mn, Co, Fe, and Ni, an alloy containing one or more of these metals, an alloy containing these metals and at least one element of B, C, and N, or the like. Specifically, the ferromagnetic material may be, for example, Co—Fe, Co—Fe—B, or Ni—Fe.

When the above-described Heusler alloy, and Co, Fe, or CoFe alloy are laminated, a magnetization stability of the Heusler alloy can be increased. Further, an insertion layer may be disposed between the first ferromagnetic layer 1 and the nonmagnetic spacer layer 3 and/or between the second ferromagnetic layer 2 and the nonmagnetic spacer layer 3. The insertion layer may contain, for example, Co, Fe, or a CoFe alloy. The insertion layer may be made of, for example, Co, Fe, or a CoFe alloy. The insertion layer is preferably $Co_xFe_{1-x}$ ($0.5 \leq x \leq 0.8$). A film thickness of the insertion layer is preferably 0.2 nm or more and 1.2 nm or less. The insertion layer enhances lattice matching properties between the first ferromagnetic layer 1 and the nonmagnetic spacer layer 3 and/or between the second ferromagnetic layer 2 and the nonmagnetic spacer layer 3. Also, since the insertion layer is thin, spin scattering due to the insertion layer can be suppressed.

In order to make the second ferromagnetic layer 2 the fixed layer, a coercivity of the second ferromagnetic layer 2 is made larger than a coercivity of the first ferromagnetic layer 1. When an antiferromagnetic material such as IrMn or PtMn is made to be adjacent to the second ferromagnetic layer 2, the coercivity of the second ferromagnetic layer 2 is increased. Also, in order to prevent a leakage magnetic field of the second ferromagnetic layer 2 from affecting the first ferromagnetic layer 1, the second ferromagnetic layer 2 may have a synthetic ferromagnetic coupling structure.

(Nonmagnetic Spacer Layer)

The nonmagnetic spacer layer 3 is made of, for example, an insulator. In this case, the nonmagnetic spacer layer 3 serves as a tunnel barrier layer. The insulator used for the nonmagnetic spacer layer 3 may be, for example, $TiO_2$, $HfO_2$, $Al_2O_3$, $SiO_2$, MgO, $ZnAl_2O_4$, $\gamma\text{-}Al_2O_3$, $MgGa_2O_4$, $MgAl_2O_4$, or the like. Also, the insulator may have a mixed crystal structure containing any one of the above as a main component. Besides these, the insulator may be a material in which a part of Al, Si, and Mg is substituted with Zn, Be, or the like. Among these materials, when MgO or $MgAl_2O_4$ is used, the nonmagnetic spacer layer 3 exhibits a coherent tunneling effect, and the magnetoresistance effect element 10 exhibits a high MR ratio. The nonmagnetic spacer layer 3 may be made of, for example, a metal. In this case, the metal is, for example, an alloy containing at least one metal element of Cu, Au, Ag, Cr, V, Al, W, and Pt, or the like. Further, the nonmagnetic spacer layer 3 may be made of a semiconductor. In this case, the semiconductor may be, for example, Si, Ge, ZnO, GaO, InSnO, InZnO, $CuInSe_2$, $CuGaSe_2$, Cu (In, Ga)$Se_2$, or the like.

In order to make an RA of the magnetoresistance effect element 10 small and obtain a high MR ratio, the nonmagnetic spacer layer 3 is preferably made of a metal.

The nonmagnetic spacer layer 3 may be Ag or an Ag alloy. When the nonmagnetic spacer layer 3 is made of Ag or an Ag alloy, matching between a Fermi surface of the ferromagnetic layer and a Fermi surface of the nonmagnetic spacer layer becomes satisfactory, and the magnetoresistance effect element exhibits a higher MR ratio. The Ag alloy may be, for example, $Ag_{1-x}Sn_x$, $Ag_{1-x}Mg_x$, $Ag_{1-x}Zn_x$, $Ag_{1-x}Al_x$, or the like. Here, a range of x may be, for example, 0<x<0.25. When the range of x is this range, lattice mismatching between the ferromagnetic layer and the nonmagnetic spacer layer 3 decreases and matching between Fermi surfaces of the respective layers becomes satisfactory.

When the nonmagnetic spacer layer 3 is made of an insulating material, a film thickness thereof is preferably 0.4 nm or more and 3 nm or less. When the nonmagnetic spacer layer 3 is made of a metal, a film thickness thereof is preferably 1 nm or more and 10 nm or less. When the nonmagnetic spacer layer 3 is made of a semiconductor, a film thickness thereof is preferably 0.6 nm or more and 5 nm or less. Thereby, the MR ratio of the magnetoresistance effect element increases.

(Shape and Dimensions of Element)

A laminate formed from the first ferromagnetic layer 1, the nonmagnetic spacer layer 3, and the second ferromagnetic layer 2 constituting the magnetoresistance effect element 10 is microfabricated into a columnar shape using known photolithography (electron beam lithography or the like) and dry etching (Ar ion milling or the like). A shape of the laminate in a plan view can have various shapes such as a circle, a square, a triangle, a polygon, and the like, but it is preferable that the shape be circular from a viewpoint of symmetry. That is, it is preferable that the laminate have a circular columnar shape.

When the laminate has a circular columnar shape, it is preferable that a diameter in a plan view be 80 nm or less, more preferably 60 nm or less, and still more preferably 30 nm or less. When the diameter is 80 nm or less, a domain structure cannot be easily formed in ferromagnetism, and it is not necessary to consider components different from the spin polarization in the ferromagnetic layer. Further, when the diameter is 30 nm or less, the ferromagnetic layer has a single domain structure, and a rate and a probability of magnetization reversal are improved. In addition, there is a strong demand particularly for a lower resistance in a magnetoresistance effect element that has been miniaturized.

(Other)

In the present embodiment, a top pin structure in which the first ferromagnetic layer 1 is the free layer and the second ferromagnetic layer 2 is the fixed layer has been exemplified as the magnetoresistance effect element 10. However, the structure of the magnetoresistance effect element 10 is not limited to the case and may have a bottom pin structure.

As described above, the magnetoresistance effect element 10 according to the present embodiment contains a metal compound having a half-Heusler type, and the metal compound contains a predetermined functional material. The functional material increases a stability of the half-Heusler type crystal structure by penetrating into lattice vacancies. Also, since the functional material does not significantly distort the crystal structure of the half-Heusler type crystal structure, a high spin polarization that is intrinsic in the metal compound having the half-Heusler type crystal structure can be maintained. As a result, the magnetoresistance effect element 10 according to the present embodiment is improved in the MR ratio compared to a case in which the functional material is not contained.

The magnetoresistance effect element according to the present embodiment can be used as a magnetic sensor or a memory such as a magnetic random access memory (MRAM).

"Method of Manufacturing Magnetoresistance Effect Element"

Next, a method of manufacturing a magnetoresistance effect element will be described.

The method of manufacturing a magnetoresistance effect element according to the present embodiment includes a step of laminating the first ferromagnetic layer 1, the nonmagnetic spacer layer 3, and the second ferromagnetic layer 2. These layers can be laminated using a known method such as a sputtering method, a vapor deposition method, a laser ablation method, or molecular beam epitaxy (MBE) method.

(Evaluation Method)

Figure 3:
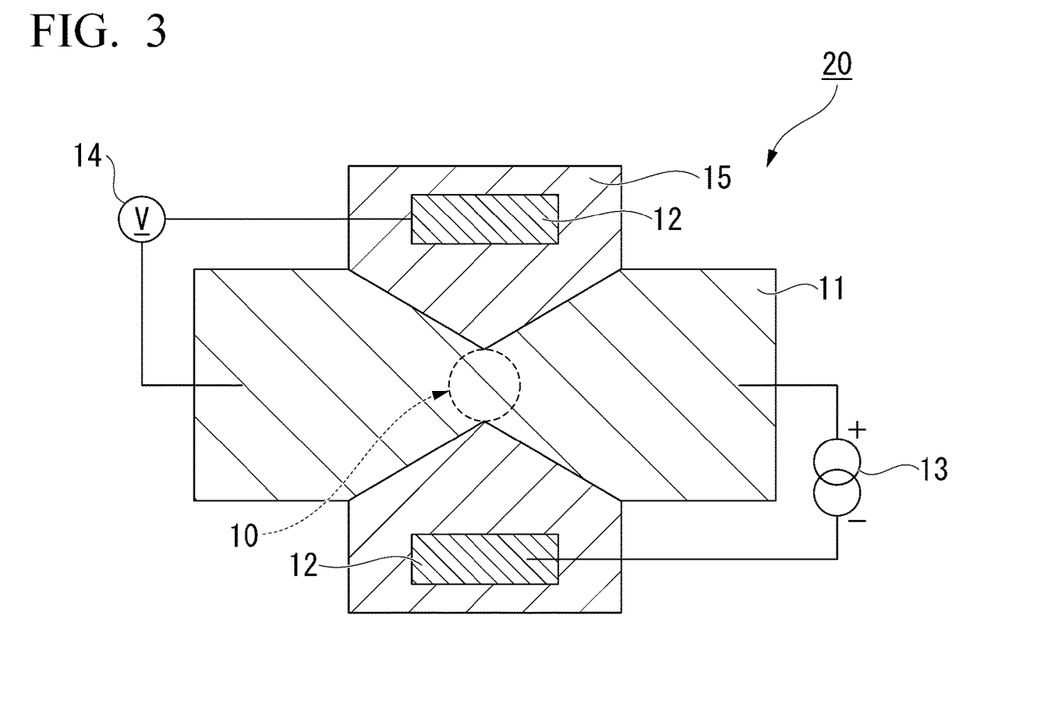
FIG. 3 is a schematic view of a magnetoresistance device having the magnetoresistance effect element according to the present embodiment.

An MR ratio of the fabricated magnetoresistance effect element 10 was measured. FIG. 3 is a schematic view of the magnetoresistance effect device used for measuring the MR ratio in a plan view from a lamination direction. The magnetoresistance effect element 10 was disposed at a position at which a first wiring 15 and a second wiring 11 intersect. The magnetoresistance effect element 10 was a circular columnar shape having a diameter of 80 nm. Also, an electrode 12 was disposed on the first wiring 15, and the electrode 12 was connected to a power supply 13 and a voltmeter 14. When a voltage is applied by the power supply 13, a current flows in the lamination direction of the magnetoresistance effect element 10. A potential difference of the magnetoresistance effect element 10 at this time is monitored by the voltmeter 14. Then, change in resistance of the magnetoresistance effect element is observed by applying a current or voltage to the magnetoresistance effect element 10 while sweeping a magnetic field from the outside.

The MR ratio is generally expressed by the following equation.

$$\text{MR ratio (\%)} = (R_{AP} - R_P)/R_P \times 100$$

$R_P$ is resistance when magnetization directions of the first ferromagnetic layer 1 and the second ferromagnetic layer 2 are parallel to each other, and $R_{AP}$ is resistance when the magnetization directions of the first ferromagnetic layer 1 and the second ferromagnetic layer 2 are antiparallel.

A composition analysis of the first ferromagnetic layer 1 and the second ferromagnetic layer 2 was performed by energy dispersive X-ray spectroscopy (EDS) in a transmission electron microscope (TEM) after preparing a thin sample using a focused ion beam. For example, when a functional material is B, a composition proportion of B was defined as an atomic composition percentage (at %), and was 100×"number of B atoms"/("number of X atoms"+"number of Y atoms"+"number of Z atoms"+"number of B atoms"). Further, the analysis method is not limited thereto, and can also be performed using a secondary ion mass spectrometry (SIMS) method, an atom probe method, and an electron energy loss spectroscopy (EELS) method.

The analysis result of the TEM-EDS was a value obtained by subtracting a background signal of the measurement element.

EXAMPLE

Example 1-1

The magnetoresistance effect element 10 shown in FIG. 1 was fabricated on an MgO (001) substrate. First, Cr of 20 nm and Ag of 40 nm were laminated in this order on the substrate as an underlayer (also serving as the first wiring 15 to be described below), and NiMnSbB of 30 nm was laminated as the first ferromagnetic layer 1. Next, Ag of 5 nm was laminated as the nonmagnetic spacer layer 3 on the first ferromagnetic layer 1. Next, NiMnSbB of 6 nm was laminated as the second ferromagnetic layer 2 on the nonmagnetic spacer layer 3, Ru of 20 nm was deposited as a cap layer (also serving as the second wiring 11 to be described below), and thereby the magnetoresistance effect element 10 was obtained. Each layer on the substrate was fabricated by a sputtering method, and Ar was used as a sputtering gas. Also, NiMnSbB was deposited by co-sputtering of a NiMnSb target and a B target. After the magnetoresistance effect element was formed, a heat treatment in a magnetic field was performed to impart uniaxial magnetic anisotropy to the first ferromagnetic layer 1 and the second ferromagnetic layer 2. A heat treatment temperature in the heat treatment in the magnetic field was 300° C., and an applied magnetic field strength was 5 kOe (399 kA/m).

Using the method described above, a composition proportion of B contained in the first ferromagnetic layer 1 and the second ferromagnetic layer 2 and an MR ratio of the magnetoresistance effect element were measured.

The composition proportion of B contained in the first ferromagnetic layer 1 and the second ferromagnetic layer 2 was 0.1 at %. Here, the composition proportion of B was measured by preparing a thin sample using a focused ion beam and performing energy dispersive X-ray spectroscopy (EDS) in a transmission electron microscope (TEM).

Examples 1-2 to 1-7

The magnetoresistance effect element 10 was fabricated under the same conditions as in Example 1-1 except that the composition proportion of B contained in NiMnSb was changed by changing the condition of co-sputtering of the NiMnSb target and the B target in Example 1-1. Also, the composition proportion and the MR ratio of B were measured in the same procedure as in Example 1-1. The results are shown in Table 1.

Comparative Example 1-1

The magnetoresistance effect element 10 was fabricated under the same conditions as in Example 1-1 except that the first ferromagnetic layer 1 and the second ferromagnetic layer 2 were fabricated using only the NiMnSb target without using the B target in contrast to the fabrication conditions of Example 1-1. Also, the composition proportion and the MR ratio of B were measured in the same procedure as in Example 1-1. The results are shown in Table 1. The composition proportion of B in Comparative Example 1-1 was below a detection limit (0.01 at % or less).

TABLE 1

|  | Composition proportion of B (at %) | MR Ratio (%) |
|---|---|---|
| Comparative example 1-1 | 0 | 4.2 |
| Example 1-1 | 0.1 | 6.8 |
| Example 1-2 | 0.6 | 7.3 |
| Example 1-3 | 1.2 | 7.5 |
| Example 1-4 | 3.9 | 8.6 |
| Example 1-5 | 4.5 | 9.1 |
| Example 1-6 | 7.3 | 9.8 |
| Example 1-7 | 9.8 | 7.1 |

Examples 2-1 to 2-7

The magnetoresistance effect element 10 was fabricated under the same conditions as in Example 1-1 except that the first ferromagnetic layer 1 and the second ferromagnetic layer 2 were fabricated by co-sputtering of the NiMnSb target and a C target.

TABLE 2

|  | Composition proportion of C (at %) | MR Ratio (%) |
|---|---|---|
| Comparative example 1-1 | 0 | 4.2 |
| Example 2-1 | 0.11 | 5.6 |
| Example 2-2 | 0.53 | 6.1 |
| Example 2-3 | 1.6 | 6.3 |
| Example 2-4 | 4.2 | 7.2 |
| Example 2-5 | 5.6 | 8.1 |
| Example 2-6 | 6.3 | 8.8 |
| Example 2-7 | 8.8 | 7.1 |

Examples 3-1 to 3-7

The magnetoresistance effect element 10 was fabricated under the same conditions as in Example 1-1 except that the first ferromagnetic layer 1 and the second ferromagnetic layer 2 were fabricated by sputtering of the NiMnSb target in a mixed gas of Ar and nitrogen. A composition proportion of nitrogen was controlled by a partial pressure ratio of Ar and nitrogen.

TABLE 3

|  | Composition proportion of N (at %) | MR Ratio (%) |
|---|---|---|
| Comparative example 1-1 | 0 | 4.2 |
| Example 3-1 | 0.09 | 5.2 |
| Example 3-2 | 0.56 | 5.1 |
| Example 3-3 | 1.1 | 5.3 |
| Example 3-4 | 3.2 | 6.8 |
| Example 3-5 | 4.7 | 7.0 |
| Example 3-6 | 5.7 | 7.6 |
| Example 3-7 | 7.2 | 6.3 |

Examples 4-1 to 4-7

The magnetoresistance effect element 10 was fabricated under the same conditions as in Example 1-1, except that the first ferromagnetic layer 1 and the second ferromagnetic layer 2 were fabricated by sputtering of the NiMnSb target in a mixed gas of Ar and fluorine. A composition proportion of fluorine was controlled by a partial pressure ratio of Ar and fluorine.

TABLE 4

|  | Composition proportion of F (at %) | MR Ratio (%) |
|---|---|---|
| Comparative example 1-1 | 0 | 4.2 |
| Example 4-1 | 0.13 | 4.7 |
| Example 4-2 | 0.46 | 4.9 |
| Example 4-3 | 0.9 | 5.3 |
| Example 4-4 | 2.2 | 5.8 |
| Example 4-5 | 3.7 | 6.0 |
| Example 4-6 | 4.7 | 6.6 |
| Example 4-7 | 7.2 | 5.3 |

EXPLANATION OF REFERENCES

1 First ferromagnetic layer
2 Second ferromagnetic layer
3 Nonmagnetic spacer layer
10 Magnetoresistance effect element
11 Second wiring
12 Electrode 13 Power supply
14 Voltmeter
15 First wiring
20 Magnetoresistance effect device

What is claimed is:

1. A magnetoresistance effect element comprising:
a first ferromagnetic layer;
a second ferromagnetic layer; and
a nonmagnetic spacer layer between the first ferromagnetic layer and the second ferromagnetic layer; wherein
at least one of the first ferromagnetic layer and the second ferromagnetic layer contains a metal compound having a half-Heusler type crystal structure,
the metal compound contains a functional material, and X atoms, Y atoms, and Z atoms which form a unit lattice of the half-Heusler type crystal structure, and
the functional material has an atomic number lower than an atomic number of any of the X atoms, the Y atoms, and the Z atoms,
wherein the functional material is one or more of atoms selected from the group consisting of B and C,
the metal compound has a crystal structure of an A2 structure, a $C1_b$ structure or a B2 structure.

2. The magnetoresistance effect element according to claim 1, wherein
the functional material is boron, and
a composition proportion of the functional material in the metal compound is 0.1 at % or more and 9.8 at % or less.

3. The magnetoresistance effect element according to claim 1, wherein
the functional material is carbon, and
a composition proportion of the functional material in the metal compound is 0.11 at % or more and 8.8 at % or less.

4. The magnetoresistance effect element according to claim 1, wherein
the X atoms are one or more of atoms selected from the group consisting of Fe, Co, Ni, Cu, Zn, Ru, Rh, Pd, Ag, Cd, Ir, Pt, and Au,
the Y atoms are one or more of atoms selected from the group consisting of Ti, V, Cr, Mn, Y, Zr, Nb, Hf, Ta, Gd, Tb, Dy, Hd, Er, Fe, Tm, Yb, and Lu, and
the Z atoms are one or more of atoms selected from the group consisting of Al, Si, Ga, Ge, As, In, Sn, Sb, Tl, Pd, Bi, Se, and Te.

5. The magnetoresistance effect element according to claim 4, wherein
the X atoms are one or more of atoms selected from the group consisting of Ni, Pd, Pt, Co, and Rh,
the Y atoms are one or more of atoms selected from the group consisting of Mn, Cr, Fe, and V, and
the Z atoms are one or more of atoms selected from the group consisting of Se, Te, and Sb.

6. The magnetoresistance effect element according to claim 1, wherein the metal compound has a crystal structure of a $C1_b$ structure or a B2 structure.

7. The magnetoresistance effect element according to claim 1, wherein
one of the first ferromagnetic layer and the second ferromagnetic layer contains a metal compound having a half-Heusler type crystal structure, and the other thereof contains a metal compound having a full-Heusler type crystal structure, and
the metal compound having a full-Heusler type crystal structure contains the X atoms, the Y atoms, and the Z atoms.

8. The magnetoresistance effect element according to claim 7, wherein
the metal compound having a full-Heusler type crystal structure is expressed by a compositional formula $Co_2L_\alpha M_\beta$,
L atoms include at least one of Mn and Fe atoms,
M atoms include at least one of Al, Si, Ge, and Ga atoms,
$\alpha$ satisfies $0.7<\alpha<1.6$, and
$\beta$ satisfies $0.65<\beta<1.35$.

9. The magnetoresistance effect element according to claim 1, comprising:
an insertion layer between at least one of the first ferromagnetic layer and the second ferromagnetic layer, and the nonmagnetic spacer layer, wherein
the insertion layer contains Co, Fe, or a CoFe alloy.

10. The magnetoresistance effect element according to claim 9, wherein a film thickness of the insertion layer is 0.2 nm or more and 1.2 nm or less.

11. The magnetoresistance effect element according to claim 1, wherein the nonmagnetic spacer layer is a metal.

12. The magnetoresistance effect element according to claim 11, wherein the nonmagnetic spacer layer is Ag or an Ag alloy.

13. A magnetoresistance effect element comprising:
a first ferromagnetic layer;
a second ferromagnetic layer; and
a nonmagnetic spacer layer between the first ferromagnetic layer and the second ferromagnetic layer; wherein
at least one of the first ferromagnetic layer and the second ferromagnetic layer contains a metal compound having a half-Heusler type crystal structure,
the metal compound contains a functional material, and X atoms, Y atoms, and Z atoms which form a unit lattice of the half-Heusler type crystal structure; and
the functional material has an atomic number lower than an atomic number of any of the X atoms, the Y atoms, and the Z atoms, wherein
the functional material is nitrogen, and
a composition proportion of the functional material in the metal compound is 0.09 at % or more and 7.2 at % or less,
the metal compound has a crystal structure of an A2 structure, a $C1_b$ structure or a B2 structure,
the functional material penetrates between lattices of the half-Heusler type crystal structure.

14. A magnetoresistance effect element comprising:
a first ferromagnetic layer;
a second ferromagnetic layer; and
a nonmagnetic spacer layer between the first ferromagnetic layer and the second ferromagnetic layer; wherein
at least one of the first ferromagnetic layer and the second ferromagnetic layer contains a metal compound having a half-Heusler type crystal structure,
the metal compound contains a functional material, and X atoms, Y atoms, and Z atoms which form a unit lattice of the half-Heusler type crystal structure; and
the functional material has an atomic number lower than an atomic number of any of the X atoms, the Y atoms, and the Z atoms, wherein
the functional material is fluorine, and
a composition proportion of the functional material in the metal compound is 0.13 at % or more and 7.2 at % or less.

15. A magnetoresistance effect element comprising:
a first ferromagnetic layer;
a second ferromagnetic layer; and
a nonmagnetic spacer layer between the first ferromagnetic layer and the second ferromagnetic layer; wherein
at least one of the first ferromagnetic layer and the second ferromagnetic layer contains a metal compound having a half-Heusler type crystal structure,
the metal compound contains a functional material, and X atoms, Y atoms, and Z atoms which form a unit lattice of the half-Heusler type crystal structure; and
the functional material has an atomic number lower than an atomic number of any of the X atoms, the Y atoms, and the Z atoms, wherein
the functional material is one or more of atoms selected from the group consisting of Li, Be, O, Na and Mg.

* * * * *